United States Patent
Park (10) Patent No.: US 8,981,875 B2
(45) Date of Patent: Mar. 17, 2015

(54) TUNABLE MEMS RESONATORS

(71) Applicant: QUALCOMM Incorporated, San Diego, CA (US)

(72) Inventor: Sang-June Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/751,455

(22) Filed: Jan. 28, 2013

(65) Prior Publication Data

US 2014/0009249 A1 Jan. 9, 2014

Related U.S. Application Data

(63) Continuation of application No. 12/488,404, filed on Jun. 19, 2009, now Pat. No. 8,362,853.

(51) Int. Cl.
*H03H 9/24* (2006.01)
*H03B 5/30* (2006.01)
(Continued)

(52) U.S. Cl.
CPC ...... *H03H 9/02244* (2013.01); *E05Y 2900/402* (2013.01); *H01P 1/127* (2013.01); *H01P 1/2084* (2013.01); *H03H 9/462* (2013.01)
USPC ........... 333/186; 333/132; 333/188; 333/224; 333/232; 331/166 M; 331/107 DP; 331/154

(58) Field of Classification Search
USPC .................. 333/186–188, 207, 209, 223, 224, 333/231–233, 132; 331/107 DP, 116 M, 154
See application file for complete search history.

(56) References Cited

U.S. PATENT DOCUMENTS

| 4,692,727 A | 9/1987 | Wakino et al. |
| 5,406,234 A | 4/1995 | Willems |

(Continued)

FOREIGN PATENT DOCUMENTS

| CN | 1310374 C | 4/2007 |
| EP | 1429413 | 6/2004 |

(Continued)

OTHER PUBLICATIONS

Liu et al.; "A 3.4-6.2 GHz Continuously Tunable Electrostatic MEMS Resonator with Quality Factor of 460-530"; 2009 IEEE MTT-S International Microwave Symposium Digest, Jun. 7-12, 2009, pp. 1149-1152.*

(Continued)

*Primary Examiner* — Barbara Summons
(74) *Attorney, Agent, or Firm* — Knobbe Martens Olson & Bear LLP (57) ABSTRACT

Tunable MEMS resonators having adjustable resonance frequency and capable of handling large signals are described. In one exemplary design, a tunable MEMS resonator includes (i) a first part having a cavity and a post and (ii) a second part mated to the first part and including a movable layer located under the post. Each part may be covered with a metal layer on the surface facing the other part. The movable plate may be mechanically moved by a DC voltage to vary the resonance frequency of the MEMS resonator. The cavity may have a rectangular or circular shape and may be empty or filled with a dielectric material. The post may be positioned in the middle of the cavity. The movable plate may be attached to the second part (i) via an anchor and operated as a cantilever or (ii) via two anchors and operated as a bridge.

18 Claims, 10 Drawing Sheets

(51) Int. Cl.
*H03H 9/46* (2006.01)
*H01P 7/06* (2006.01)
*H03H 9/02* (2006.01)
*H01P 1/12* (2006.01)
*H01P 1/208* (2006.01)

(56) References Cited

U.S. PATENT DOCUMENTS

| | | | |
|---|---|---|---|
| 5,839,062 | A | 11/1998 | Nguyen et al. |
| 6,154,106 | A | 11/2000 | De Lillo |
| 6,625,004 | B1 | 9/2003 | Musolf et al. |
| 7,095,295 | B1 | 8/2006 | Stalford et al. |
| 7,299,534 | B2 * | 11/2007 | Rauscher ............. 29/600 |
| 7,463,121 | B2 * | 12/2008 | D'Ostilio ............. 333/223 |
| 7,511,870 | B2 | 3/2009 | Ho et al. |
| 7,671,710 | B2 | 3/2010 | Yoshida et al. |
| 7,701,312 | B2 | 4/2010 | Park et al. |
| 7,728,701 | B2 | 6/2010 | Lin et al. |
| 7,804,382 | B2 | 9/2010 | Shin et al. |
| 7,924,109 | B2 | 4/2011 | Ogasawara |
| 7,937,054 | B2 | 5/2011 | Laberge et al. |
| 8,362,853 | B2 * | 1/2013 | Park ............. 333/186 |
| 2001/0022543 | A1 | 9/2001 | Ando et al. |
| 2002/0025595 | A1 | 2/2002 | Xu et al. |
| 2003/0227338 | A1 * | 12/2003 | Kawakubo et al. ..... 331/107 A |
| 2004/0061563 | A1 | 4/2004 | Akeyama et al. |
| 2004/0075158 | A1 | 4/2004 | Nakayama |
| 2005/0170656 | A1 | 8/2005 | Nasiri et al. |
| 2006/0056132 | A1 | 3/2006 | Yoshida et al. |
| 2006/0226934 | A1 | 10/2006 | Ohguro |
| 2007/0194865 | A1 | 8/2007 | Weitzenberger et al. |
| 2007/0236307 | A1 | 10/2007 | Liu |
| 2007/0257750 | A1 | 11/2007 | Tilmans et al. |
| 2008/0252401 | A1 * | 10/2008 | Margomenos et al. ..... 333/210 |
| 2011/0241802 | A1 * | 10/2011 | Joshi et al. ............. 333/209 |

FOREIGN PATENT DOCUMENTS

| | | |
|---|---|---|
| EP | 1429457 A2 | 6/2004 |
| EP | 1852935 | 11/2007 |
| EP | 1885018 A1 | 2/2008 |
| JP | S5146855 A | 4/1976 |
| JP | S6368206 U | 5/1988 |
| JP | H07336139 A | 12/1995 |
| JP | 08213282 | 8/1996 |
| JP | 2001257511 A | 9/2001 |
| JP | 2002521222 A | 7/2002 |
| JP | 2003124063 A | 4/2003 |
| JP | 2006289520 A | 10/2006 |
| WO | WO-2004045018 A1 | 5/2004 |
| WO | WO-2004084340 A1 | 9/2004 |

OTHER PUBLICATIONS

Joshi et al.; "Highly Loaded Evanescent Cavities for Widely Tunable High-Q Filters"; 2007 IEEE MTT-S International Microwave Symposium, Jun. 3-8, 2007, pp. 2133-2136.*

Chen, et al., "Analysis of Mode Characteristics for Deformed Square Resonators by FDTD Technique", IEEE Journal of Quantum Electronics, vol. 42, No. 1, Jan. 2006, pp. 59-63.

Chinthakindi A.K., et al., "Electrostatic Actuators with Intrinsic Stress Gradient," Journal of the Electrochemical Society, Jun. 14, 2002, vol. 149(8), pp. H139-H145.

Hoft, et al., "Corner Rounding for Increased Quality Factor of Cavity Resonators," Asia-Pacific Microwave Conference Proceedings APMC, 2005, vol. 1, pp. 4-7.

IEEE Xplore Abstract page For Liu et al. "A 3.4-6.2 GHz Continuously Tunable Electrostatic MEMS Resonator with Quality Factor of 460-530"; Issue date Jun. 7-12, 2009.

International Search Report and Written Opinion—PCT/US2010/039374—International Search Authority, European Patent Office, Feb. 16, 2011.

Klaasse G, et al., "Piezoelectric Versus Electrostatic Actuation for a Capacitive RF-MEMS Switch," Conference Proceedings of the 3rd Workshop on Semiconductor Sensors and Actuators, SeSens, Leuven, Belgium Nov. 29, 2002, pp. 631-634, appears in ESAT-MICAS, Microelectronics and Sensors.

Park, et al., "High-Q RF-MEMS Tunable Evanescent-Mode Cavity Filter," IEEE MTT-S International Microwave Symposium Digest, Jun. 7-12, 2009, pp. 1145-1148.

Partial International Search Report—PCT/US2010/039374—International Search Authority, European Patent Office dated Oct. 8, 2010.

Taiwan Search Report—TW099120044—TIPO—Sep. 23, 2013.

* cited by examiner

TUNABLE MEMS RESONATORS

CROSS-REFERENCE TO RELATED APPLICATIONS

This application is a continuation of U.S. application Ser. No. 12/488,404, filed Jun. 19, 2009 and scheduled to issue on Jan. 29, 2013 as U.S. Pat. No. 8,362,853. The disclosure of U.S. application Ser. No. 12/488,404 is hereby incorporated by reference in its entirety.

FIELD

The present disclosure relates generally to electronics, and more specifically to micro-electro-mechanical system (MEMS) resonators.

DESCRIPTION OF THE RELATED TECHNOLOGY

MEMS is a technology used to form miniature electro-mechanical devices with mechanical moving parts. These devices may be used to implement various radio frequency (RF) circuit components such as resonators, switches, variable capacitors (varactors), inductors, etc. MEMS devices may have certain advantages over RF circuit components fabricated in other manners, such as higher quality factor (Q), lower insertion loss, better linearity, etc.

A MEMS resonator is a MEMS device that can resonate at a particular frequency, which may be referred to as the resonance frequency. A MEMS resonator may be implemented using various structures known in the art. A particular structure and suitable dimensions may be selected to obtain the desired resonance frequency for the MEMS resonator.

A MEMS resonator may be used for a low-power application with a small RF signal. In this case, the resonance frequency of the MEMS resonator may not be affected too much by the RF signal. However, the RF signal may be large for a high-power application, such as a transmitter of a wireless communication device. If a large RF signal is applied to the MEMS resonator, then the resonance frequency of the MEMS resonator may be varied by the RF signal, which is typically undesirable. A MEMS resonator that can handle a large RF signal would be desirable.

DETAILED DESCRIPTION

The word "exemplary" is used herein to mean "serving as an example, instance, or illustration." Any design described herein as "exemplary" is not necessarily to be construed as preferred or advantageous over other designs.

Several exemplary designs of tunable MEMS resonators having adjustable resonance frequency and capable of handling large RF signals are described herein. A tunable MEMS resonator is a MEMS resonator having a resonance frequency that can be varied by adjusting a mechanical moving part with a direct current (DC) voltage. A tunable MEMS resonator may include two or more terminals (or electrodes). An RF signal may be applied to a first terminal, and a DC voltage may be applied to a second terminal. The DC voltage may mechanically move a plate within the MEMS resonator, which may then adjust the resonance frequency of the MEMS resonator. The tunable MEMS resonators described herein may be used for various circuits such as tunable filters, oscillators, etc. The tunable MEMS resonators may also be used for high-power applications such as a transmitter of a wireless communication device. The tunable MEMS resonators may be able to handle a large RF signal and may have a small change in resonance frequency due to the large RF signal.

Figure 1:
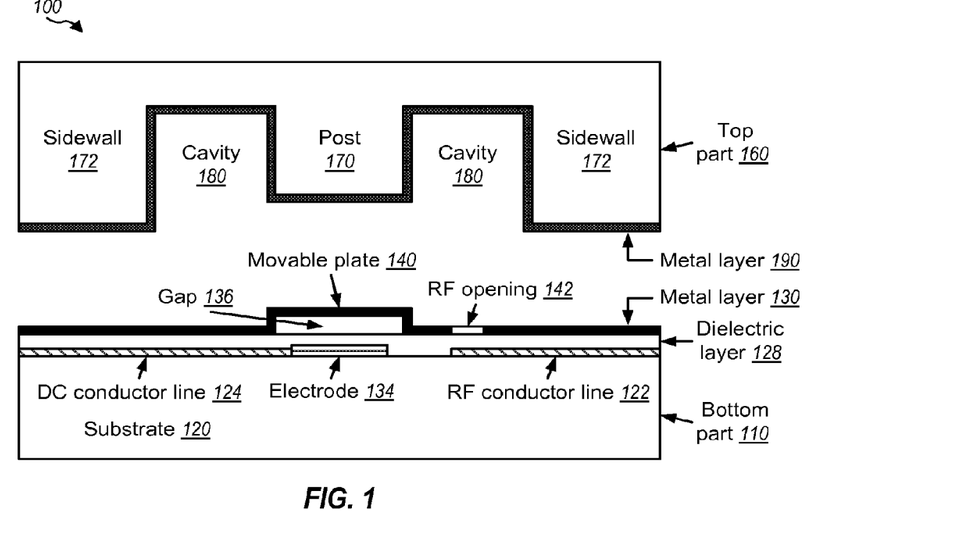
FIGS. 1 and 2 show cross-sectional views of a tunable MEMS resonator.

FIG. 1 shows a cross-sectional view of an exemplary design of a tunable MEMS resonator 100 capable of handling a large RF signal. Tunable MEMS resonator 100 includes a bottom part 110 and a top part 160. FIG. 1 shows top part 160 being disengaged from bottom part 110.

Figure 2:
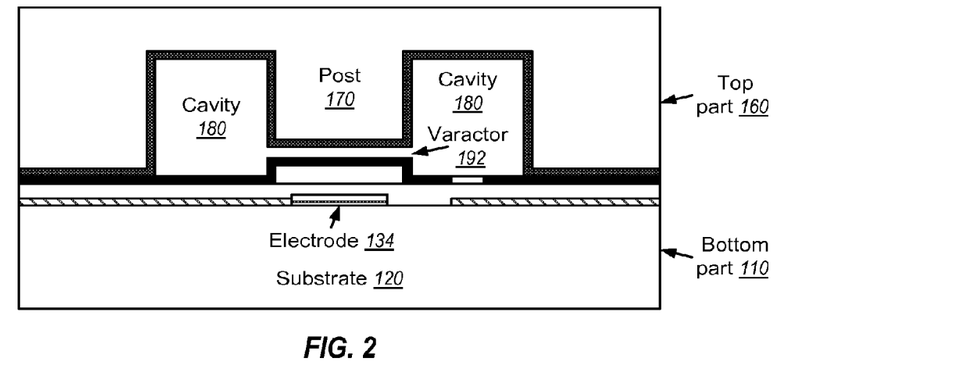

FIG. 2 shows a cross-sectional view of tunable MEMS resonator 100, with top part 160 being mated to bottom part 110. This is the configuration during normal operation.

Figure 3:
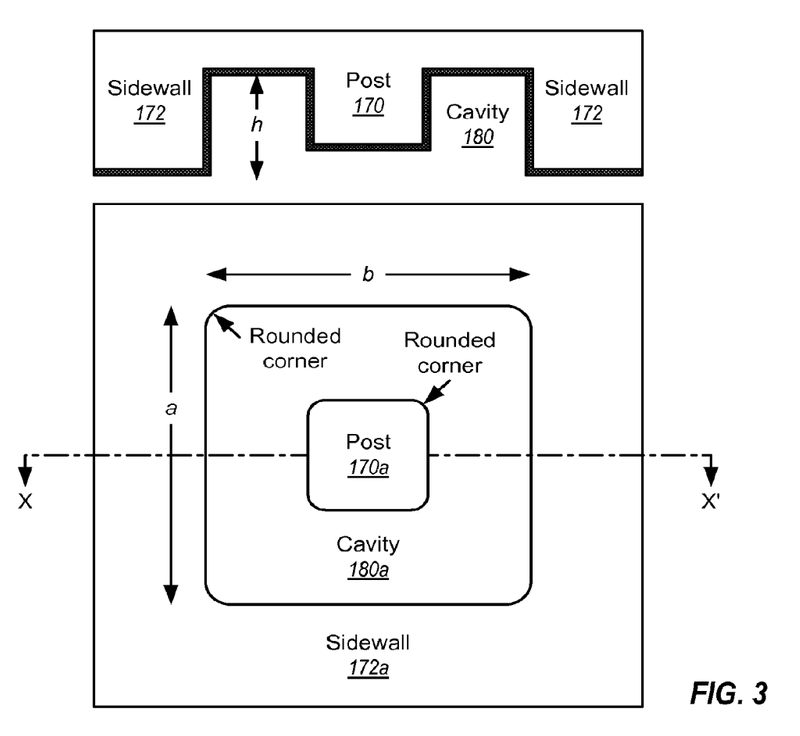
FIGS. 3 and 4 show different cavity shapes for the tunable MEMS resonator.

FIG. 3 shows a top view of an exemplary design of tunable MEMS resonator 100 in FIGS. 1 and 2 with a square cavity 180*a*. The cross-sectional views in FIGS. 1 and 2 are taken along line X-X' in FIG. 3. Greater layout efficiency may be achieved with a square cavity, and more MEMS resonators may be fabricated in a given area with the square cavity. The quality factor (Q) of MEMS resonator 100 may be improved by having rounded corners for square cavity 180*a* and rounded corners for a post 170*a*.

Figure 4:
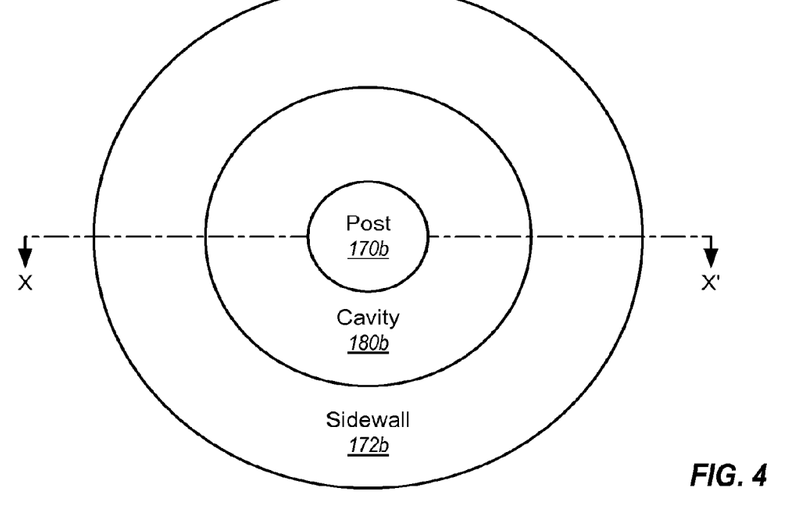

FIG. 4 shows a top view of another exemplary design of tunable MEMS resonator 100 in FIGS. 1 and 2 with a circular cavity 180*b*. The cross-sectional views in FIGS. 1 and 2 are taken along line X-X' in FIG. 4. Higher Q may be obtained for MEMS resonator 100 with a circular cavity.

Referring back to FIG. 1, bottom part 110 includes a substrate 120 upon which various structures, layers, and conductors may be formed. Substrate 120 may be glass, silicon, or some other material. Glass may have better performance as well as lower cost. A conductor line 122 may be formed on top of substrate 120 and may be used to carry an RF signal. A conductor line 124 may also be formed on top of substrate 120 and may be used to carry a DC voltage. Conductor line 124 may couple to an electrode 134, which may be formed on the top surface of substrate 120 over a center portion of bottom part 110. Electrode 134 may also be referred to as a biasing electrode, a pad, etc. Lines 122 and 124 and electrode 134 may be formed with metal or some other conductive material. A dielectric layer 128 may cover all or part of the top surface of substrate 120. A metal layer 130 may be formed on top of dielectric layer 128 over most of the top surface of substrate 120, except for the center portion of bottom part 110.

A moveable plate 140 may be formed over electrode 134 and may be separated from electrode 134 by a gap 136. Plate 140 may be implemented with a MEMS switch, as described below, and may be formed with metal or some other conductive material. Plate 140 may also be referred to as a mechanical membrane, etc.

Top part 160 includes a cavity 180, which may be formed around a post 170 (170a, 170b) and may be surrounded by sidewalls 172 (172a, 172b). Post 170 may be aligned with moveable plate 140 in bottom part 110. The dimension of cavity 180 may be selected based on the desired resonance frequency for tunable MEMS resonator 100. The bottom surface of top part 160 may be covered by a metal layer 190.

An opening 142 may be formed in metal layer 130 over one end of conductor line 122 in a portion of cavity 180. RF energy from cavity 180 may be coupled via opening 142 to line 122. The RF signal on line 122 may be provided to other circuit components to which tunable MEMS resonator 100 is connected.

Tunable MEMS resonator 100 operates as follows. Top part 160 may be mated to bottom part 110, as shown in FIG. 2, during normal operation. Cavity 180 is coated with metal, and energy is trapped inside the cavity. Since cavity 180 has low loss, the energy decays slowly. The resonant frequency within cavity 180 may be determined by the dimension of the cavity.

A variable capacitor (varactor) 192 may be formed between the bottom of post 170 and moveable plate 140. The resonance frequency of tunable MEMS resonator 100 may be adjusted or tuned by varying the capacitance of varactor 192. A DC voltage may be applied to electrode 134 on substrate 120 to cause moveable plate 140 to move down from its normal resting position shown in FIGS. 1 and 2. A larger DC voltage may cause plate 140 to move down more toward electrode 134, which may then result in less capacitance for varactor 192 and hence a higher resonance frequency for MEMS resonator 100. Conversely, a smaller DC voltage (e.g., zero Volts) may cause plate 140 to be near its resting position, which may then result in more capacitance for varactor 192 and hence a lower resonance frequency for MEMS resonator 100.

The resonance frequency of tunable MEMS resonator 100 may be controlled in various manners. The width a, length b, and height h of cavity 180 may be selected to obtain the desired resonance frequency. Table 1 shows two exemplary designs of tunable MEMS resonator 100, with dimension being given in millimeters (mm) and resonance frequency being given in megahertz (MHz). Other resonance frequencies and Q may be obtained with other dimensions for cavity 180.

TABLE 1

| Width a | Length b | Height h | Resonance frequency $f_o$ | Q |
|---------|----------|----------|---------------------------|-----|
| 3.0 mm  | 3.0 mm   | 1.5 mm   | 1630 MHz                  | 200 |
| 3.0 mm  | 3.0 mm   | 1.0 mm   | 1990 MHz                  | 170 |

Varactor 192 may be designed to obtain the desired nominal resonance frequency. Cavity 180 may be filled with a dielectric material to manipulate (e.g., lower) the resonance frequency. Multiple posts may also be formed within cavity 180 to obtain the desired resonance frequency. Each post may or may not have an associated movable plate forming a varactor for that post.

The resonance frequency of tunable MEMS resonator 100 may be varied by mechanically moving plate 140 with the DC voltage, which may then vary the capacitance of varactor 192. The tuning range of MEMS resonator 100 is the range of resonance frequencies achievable for the MEMS resonator. The tuning range may be dependent on the design of varactor 192.

Figure 5:
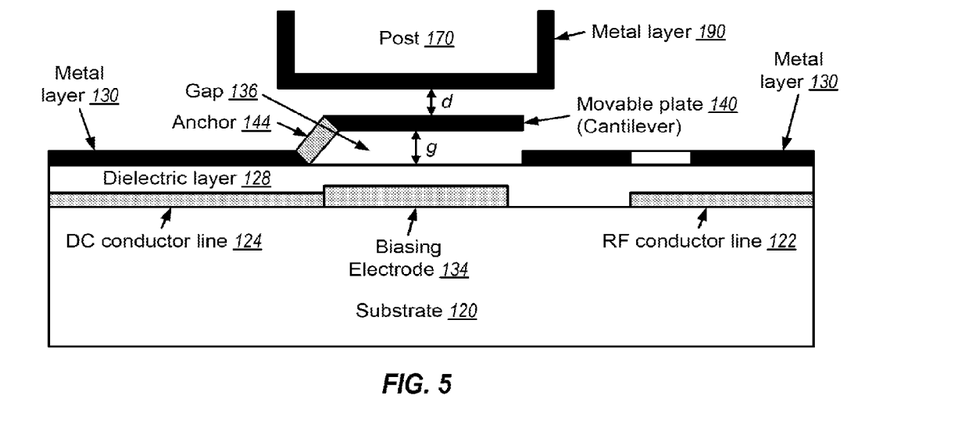
FIGS. 5 and 6 show two exemplary designs of a movable plate for the tunable MEMS resonator.

FIG. 5 shows an exemplary design of movable plate 140 within tunable MEMS resonator 100 in FIGS. 1 to 4. In this exemplary design, movable plate 140 is implemented with an MEMS switch having a cantilever structure. An anchor 144 may be formed with a dielectric material or a conductive material on one side of the center portion of bottom part 110. Movable plate 140 may then be formed over anchor 144 and may be connected to a metal layer. Movable plate 140 may act as a cantilever that may be mechanically moved toward electrode 134 by applying a DC voltage to electrode 134.

The distance between movable plate 140 and dielectric layer 128 may be denoted as g. The distance between movable plate 140 and metal layer 190 covering post 170 may be denoted as d. A maximum capacitance $C_{max}$ may be obtained with movable plate 140 at its resting position (as shown in FIG. 5), which is a distance of d from metal layer 190. A minimum capacitance $C_{min}$ may be obtained with movable plate 140 moved against dielectric layer 128, which is a distance of d+g from metal layer 190. The maximum and minimum capacitance may be expressed as:

$$C_{max} = \frac{\varepsilon_0 \cdot \varepsilon_r \cdot A}{d}, \text{ and} \qquad \text{Eq (1)}$$

$$C_{min} = \frac{\varepsilon_0 \cdot A}{g + d/\varepsilon_r}, \qquad \text{Eq (2)}$$

where $\varepsilon_0$ is a dielectric constant for air, $\varepsilon_r$ is a dielectric constant for a dielectric material between plate 140 and metal layer 190 (not shown in FIG. 5), and A is the area of plate 140.

A capacitance tuning range may be expressed as:

$$\frac{C_{max}}{C_{min}} = \frac{g \cdot \varepsilon_r + d}{d}. \qquad \text{Eq (3)}$$

If the space between plate 140 and metal layer 190 is filled with air (i.e., no dielectric material), then $\varepsilon_r = 1$, and the capacitance tuning range may be dependent on distances d and g. A larger capacitance tuning range may be obtained with (i) a larger distance g between movable plate 140 and dielectric layer 128 and/or (ii) a smaller distance d between movable plate 140 and metal layer 190. A larger capacitance tuning range may also be obtained by filling the space between plate 140 and metal layer 190 with a dielectric material having $\varepsilon_r > 1$.

Figure 6:
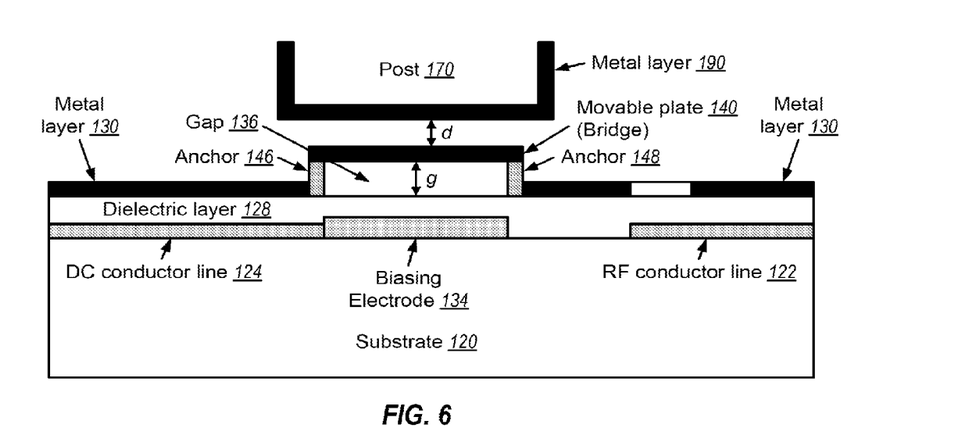

FIG. 6 shows another exemplary design of movable plate 140 within tunable MEMS resonator 100 in FIGS. 1 to 4. In this exemplary design, movable plate 140 is implemented with an MEMS switch having a bridge structure. The bridge structure may also be referred to as a fixed-fixed beam structure. Two anchors 146 and 148 may be formed on two sides of the center portion of bottom part 110. Movable plate 140 may then be formed over anchors 146 and 148 and may act as a bridge that may be mechanically moved toward electrode 134 by applying a DC voltage to electrode 134.

The distance between movable plate 140 and dielectric layer 128 may be denoted as g. The distance between movable plate 140 and metal layer 190 covering post 170 may be denoted as d. The maximum capacitance $C_{max}$ may be obtained with movable plate 140 at its resting position (as shown in FIG. 6), and the minimum capacitance $C_{min}$ may be obtained with movable plate 140 moved against dielectric layer 128. The maximum and minimum capacitance may be expressed as shown in equations (1) and (2), respectively.

FIGS. 5 and 6 show two exemplary designs of movable plate 140 to enable tuning of MEMS resonator 100. Movable plate 140 may also be implemented with other MEMS switches and/or other MEMS structures that can mechanically move to vary the capacitance of varactor 192.

A larger capacitance tuning range may be desirable in order to obtain a larger frequency tuning range for MEMS resonator 100. As shown in equations (1) to (3), a larger capacitance tuning range may be achieved with a smaller distance d between movable plate 140 in bottom part 110 and metal layer 190 in top part 160. Bottom part 110 and top part 160 may be fabricated separately and mated together, as shown in FIGS. 1 and 2. Several schemes may be used to obtain a small distance d between movable plate 140 and metal layer 190 while preventing movable plate 140 from making contact with metal layer 190.

Figure 7:
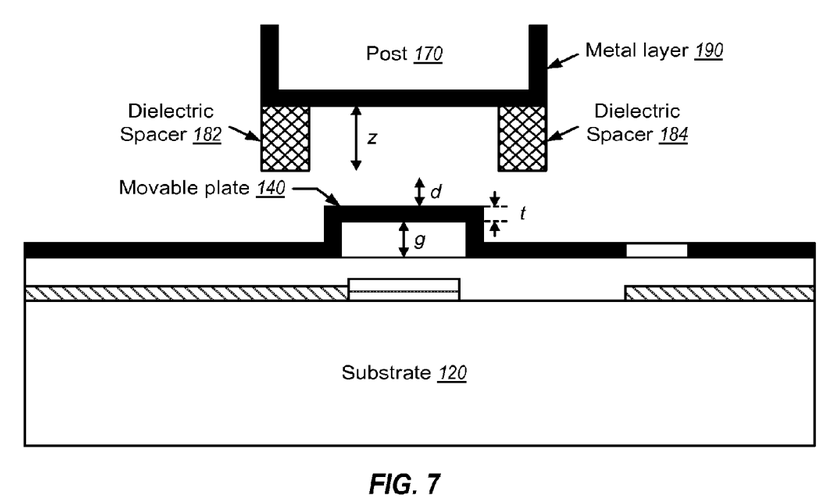
FIGS. 7 and 8 show use of spacers to prevent shorting of the movable plate.

FIG. 7 shows an exemplary design of using dielectric spacers to prevent movable plate 140 from contacting metal layer 190. In the exemplary design shown in FIG. 7, dielectric spacers 182 and 184 may be formed over metal layer 190 on both sides of movable plate 140. The height z of dielectric spacers 182 and 184 may be selected to be z≥d+g+t, where t is the thickness of movable plate 140.

Dielectric spacers 182 and 184 may be formed over metal layer 190 in top part 160, as shown in FIG. 7. In another exemplary design, dielectric spacers may be formed over metal layer 130 in bottom part 110. Dielectric spacers may be formed on both sides of movable plate 140, as shown in FIG. 7. In another exemplary design, a dielectric spacer may be formed on only one side of movable plate 140.

Figure 8:
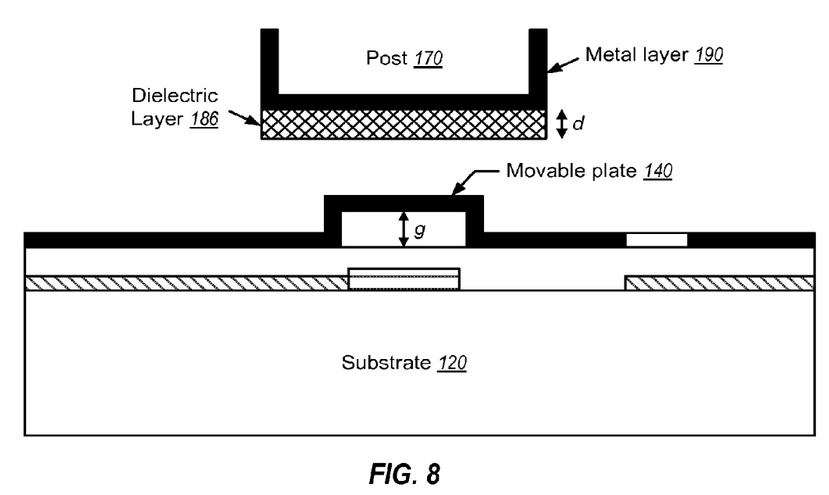

FIG. 8 shows another exemplary design of using dielectric spacer to prevent movable plate 140 from contacting metal layer 190. In the exemplary design shown in FIG. 8, a dielectric layer 186 may be formed over metal layer 190 underneath post 170. The height of dielectric spacer 186 may be selected to be equal to the desired distance d between movable plate 140 and metal layer 190.

FIGS. 7 and 8 show exemplary designs of using dielectric spacer(s) to achieve a small distance between movable plate 140 and metal layer 190 while preventing shorting. A small distance between plate 140 and metal layer 190 without shorting may also be obtained in other manners.

FIGS. 1 to 8 show an exemplary design in which a single movable plate 140 is formed under post 170. In one exemplary design, movable plate 140 may operate as a varactor having a capacitance that may be adjusted in a continuous manner between $C_{min}$ and $C_{max}$ with the DC voltage applied to electrode 134. The resonance frequency of MEMS resonator 100 may be varied by adjusting the capacitance of the varactor. In another exemplary design, movable plate 140 may operate as a varactor having a capacitance that may be switched between $C_{min}$ and $C_{max}$ in a digital manner with the DC voltage.

There may be a limit on the size of a realizable movable plate, which may be dependent on the MEMS process technology used to fabricate the movable plate. A larger capacitance tuning range and other benefits may be obtained by using multiple movable plates.

Figure 9:
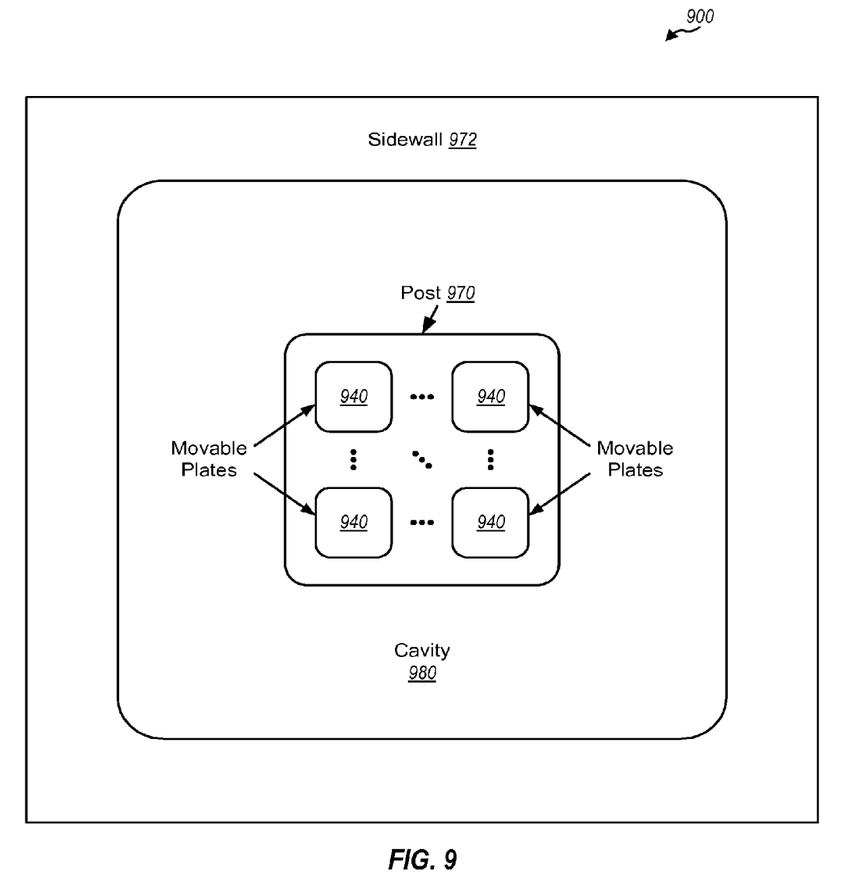
FIG. 9 shows a tunable MEMS resonator with multiple movable plates.

FIG. 9 shows a top view of an exemplary design of a tunable MEMS resonator 900 with multiple movable plates 940 formed under a post 970. In general, any number of movable plates 940 may be formed under post 970. The number of realizable movable plates 940 may be dependent on the size/area of post 970 and the size of each movable plate 940. Each movable plate 940 may be (i) moved in a continuous manner by varying a DC voltage for that movable plate or (ii) moved in a digital manner by switching the DC voltage for the movable plate. More movable plates 940 may provide a larger capacitance tuning range, which may in turn allow for a larger tuning range for MEMS resonator 900. More movable plates 940 may also provide more capacitance, which may allow for a lower resonance frequency for MEMS resonator 900.

FIGS. 1 to 4 show a single tunable MEMS resonator 100 that may be used to implement various circuit blocks such as tunable filters. A tunable filter may also be implemented with multiple tunable MEMS resonators to obtain better performance, e.g., greater attenuation of out-of-band signals.

Figure 10:
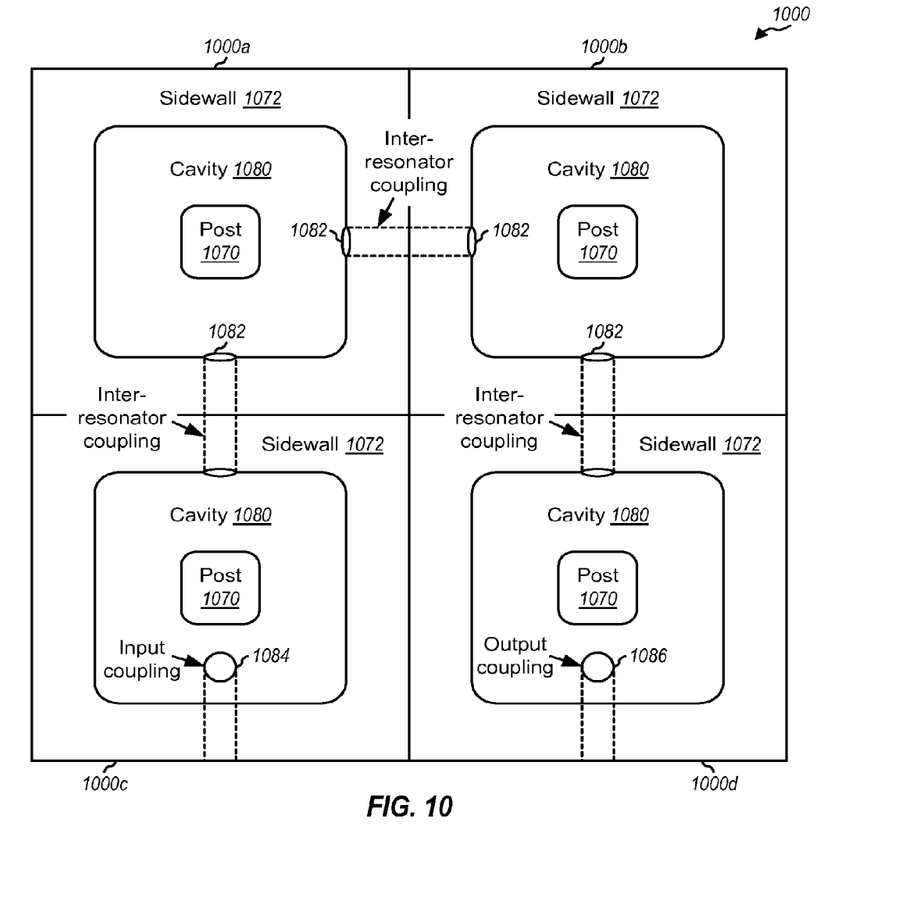
FIG. 10 shows an array of four tunable MEMS resonators.

FIG. 10 shows a top view of an exemplary design of an array of four tunable MEMS resonators 1000a, 1000b, 1000c and 1000d, which may be used for a tunable filter. In this exemplary design, each tunable MEMS resonator 1000 has a cavity 1080 formed around a post 1070 and surrounded by sidewalls 1072. Although not shown in FIG. 10, each tunable MEMS resonator 1000 may have one or more movable plates formed over post 1070 and used to adjust the resonance frequency. The surfaces of cavity 1080 for each tunable MEMS resonator 1000 may be covered with metal layers, e.g., as shown in FIGS. 1 to 4. Openings 1082 may be formed in the metal layers covering the sidewalls of adjacent MEMS resonators to pass RF signals between these MEMS resonators. An opening 1084 may be formed in the metal layer covering the bottom part of MEMS resonator 1000c to couple an input RF signal from a first RF conductor line (not shown in FIG. 10). An opening 1086 may be formed in the metal layer covering the bottom part of MEMS resonator 1000d to couple an output RF signal to a second RF conductor line (not shown in FIG. 10).

In general, a tunable MEMS resonator may be implemented with a top part and a bottom part. The bottom part may include a movable plate (e.g., implemented with a MEMS switch) and biasing circuits. The top part may have a cavity and a post. The cavity may be filled with a dielectric material to manipulate the resonance frequency. By actuating the movable plate, the field inside the cavity changes, and the resonance frequency and impedance of the cavity would also change.

The tunable MEMS resonator utilizes the biasing circuits to actuate the movable plate independent of the RF signal path. This may allow the tunable MEMS resonators to handle high power, e.g., more than 2 Watts. The high resonant field inside the cavity is isolated from the bias circuits and also from the outside environment. This makes it possible to realize high-Q resonance. The movable plate is located inside the cavity whereas the biasing circuits are located outside the cavity. This allows the movable plate to be sealed and avoids packaging issues. This also reduces energy loss due to the biasing circuits. The tunable MEMS resonator may be used in place of film bulk acoustic resonator (FBAR) and surface acoustic wave (SAW) filters and duplexers.

The tunable MEMS resonators described herein may be used for various electronics devices such as wireless communication devices, cellular phones, personal digital assistants (PDAs), handheld devices, wireless modems, laptop computers, cordless phones, broadcast receivers, Bluetooth devices, consumer electronics devices, etc. For clarity, the use of the tunable MEMS resonators in a wireless communication device, which may be a cellular phone or some other device, is described below.

Figure 11:
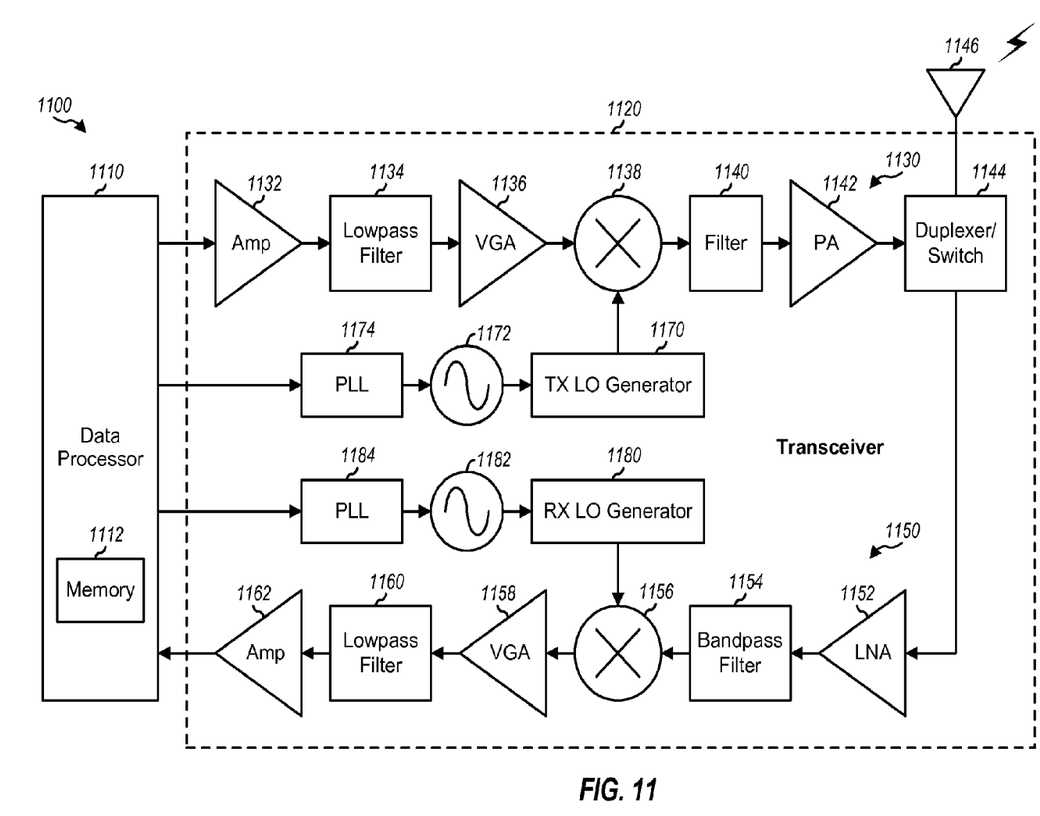
FIG. 11 shows a block diagram of a wireless communication device.

FIG. 11 shows a block diagram of an exemplary design of a wireless communication device 1100. In this exemplary design, wireless device 1100 includes a data processor 1110 and a transceiver 1120. Transceiver 1120 includes a transmitter 1130 and a receiver 1150 that support bi-directional wireless communication. In general, wireless device 1100 may include any number of transmitters and any number of receivers for any number of communication systems and any number of frequency bands.

In the transmit path, data processor 1110 processes data to be transmitted and provides an analog output signal to transmitter 1130. Within transmitter 1130, the analog output signal is amplified by an amplifier (Amp) 1132, filtered by a lowpass filter 1134 to remove images caused by digital-to-analog conversion, amplified by a variable gain amplifier (VGA) 1136, and upconverted from baseband to RF by a mixer 1138. The upconverted signal is filtered by a filter 1140 to remove images caused by the frequency upconversion, further amplified by a power amplifier (PA) 1142, routed through a duplexer/switch 1144, and transmitted via an antenna 1146. Filter 1140 may be located prior to PA 1142 (as shown in FIG. 11) or after PA 1142.

In the receive path, antenna 1146 receives signals from base stations and provides a received signal, which is routed through duplexer/switch 1144 and provided to receiver 1150. Within receiver 1150, the received signal is amplified by a low noise amplifier (LNA) 1152, filtered by a bandpass filter 1154, and downconverted from RF to baseband by a mixer 1156. The downconverted signal is amplified by a VGA 1158, filtered by a lowpass filter 1160, and amplified by an amplifier 1162 to obtain an analog input signal, which is provided to data processor 1110.

FIG. 11 shows transmitter 1130 and receiver 1150 implementing a direct-conversion architecture, which frequency converts a signal between RF and baseband in one stage. Transmitter 1130 and/or receiver 1150 may also implement a super-heterodyne architecture, which frequency converts a signal between RF and baseband in multiple stages.

A transmit local oscillator (TX LO) generator 1170 receives an oscillator signal from a voltage controlled oscillator (VCO) 1172 and provides a TX LO signal to mixer 1138. A phase locked loop (PLL) 1174 receives control information from data processor 1110 and provides a control signal to VCO 1172 to obtain the TX LO signal at the proper frequency. A receive LO (RX LO) generator 1180 receives an oscillator signal from a VCO 1182 and provides an RX LO signal to mixer 1156. A PLL 1184 receives control information from data processor 1110 and provides a control signal to VCO 1182 to obtain the RX LO signal at the proper frequency.

FIG. 11 shows an exemplary transceiver design. In general, the conditioning of the signals in transmitter 1130 and receiver 1150 may be performed by one or more stages of amplifier, filter, mixer, etc. These circuit blocks may be arranged differently from the configuration shown in FIG. 11. Furthermore, other circuit blocks not shown in FIG. 11 may also be used to condition the signals in the transmitter and receiver. Some circuit blocks in FIG. 11 may also be omitted. All or a portion of transceiver 1120 may be implemented on an analog integrated circuit (IC), an RF IC (RFIC), a mixed-signal IC, etc.

Data processor 1110 may perform various functions for wireless device 1100, e.g., processing for transmitted and received data. A memory 1112 may store program codes and data for data processor 1110. Data processor 1110 may be implemented on one or more application specific integrated circuits (ASICs) and/or other ICs.

As shown in FIG. 11, a transmitter and a receiver may include various analog circuits. Each analog circuit may be implemented in various manners and may include one or more tunable MEMS resonators described herein. For example, tunable MEMS resonators may be used in filter 1140, filter 1154, duplexer 1144, VCO 1172, VCO 1182, etc.

Figure 12:
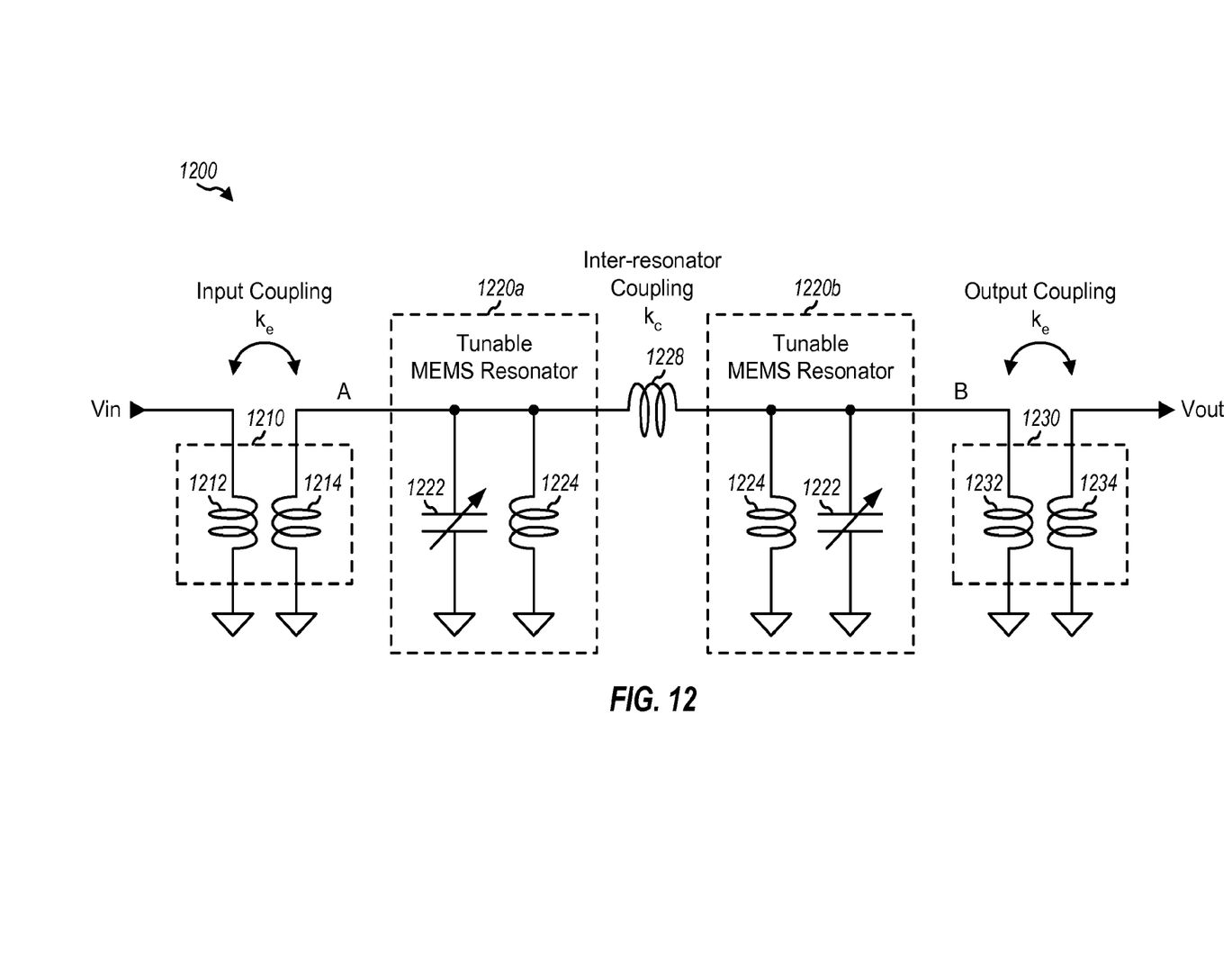
FIG. 12 shows a tunable filter implemented with tunable MEMS resonators.

FIG. 12 shows a schematic diagram of an exemplary design of a tunable filter 1200 implemented with two tunable MEMS resonators 1220a and 1220b. Tunable filter 1200 may be used for filter 1140, duplexer 1144, filter 1154, and/or other filters in wireless device 1100. Within tunable filter 1200, a transformer 1210 models the coupling between an RF conductor and tunable MEMS resonator 1220a, e.g., models RF opening 142 in FIG. 1 or RF opening 1084 in FIG. 10. Transformer 1210 receives an input signal, Vin, at one end of a primary winding 1212 and has one end of a secondary winding 1214 coupled to node A. The other ends of windings 1212 and 1214 are coupled to circuit ground. Tunable MEMS resonator 1220a is coupled between node A and circuit ground. An inductor 1228 models the coupling between tunable MEMS resonators 1220a and 1220b (e.g., RF opening 1082 in FIG. 10) and is coupled between nodes A and B. Tunable MEMS resonator 1220b is coupled between node B and circuit ground. A transformer 1230 models the coupling between tunable MEMS resonator 1220b and an RF conductor. Transformer 1230 has one end of a primary winding 1232 coupled to node B and one end of a secondary winding 1234 providing an output signal, Vout. The other ends of windings 1232 and 1234 are coupled to circuit ground.

Tunable MEMS resonators 1220a and 1220b may each be implemented, e.g., as shown in FIGS. 1 through 4. As shown in FIG. 12, each tunable MEMS resonator 1220 may be modeled with a varactor 1222 coupled in parallel with an inductor 1224. Tunable filter 1200 may have a bandpass frequency response, as described below. The center frequency of the passband may be varied by adjusting the capacitance of varactor 1222 in each tunable MEMS resonator 1220.

Figure 13:
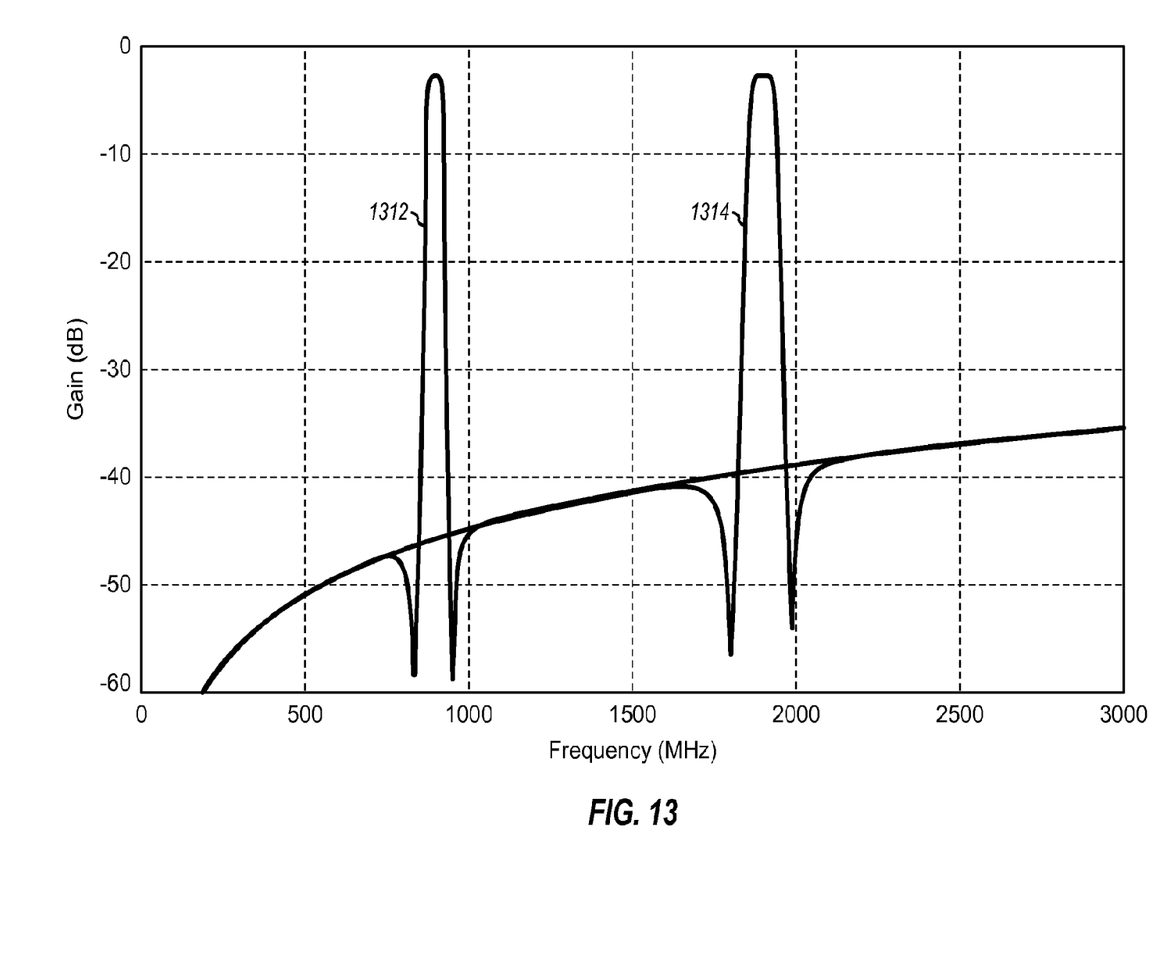
FIG. 13 shows frequency response of the tunable filter.

FIG. 13 shows plots of the frequency response of tunable filter 1200 in FIG. 12. A plot 1312 shows the frequency response of tunable filter 1200 with $C_{max}$ selected for varactor 1222 in each MEMS resonator 1220. A plot 1314 shows the frequency response of tunable filter 1200 with $C_{min}$ selected for varactor 1222 in each MEMS resonator 1220. As shown in FIG. 13, a wide tuning range from approximately 850 MHz (cellular band) to 1900 MHz (PCS band) may be achieved for tunable filter 1200. Furthermore, high Q of approximately 150 may be obtained for 850 MHz, and high Q of approximately 250 may be obtained for 1900 MHz.

In general, a tunable filter may be implemented with any number of tunable MEMS resonators. More MEMS resonators may be used to provide sharper roll-off, higher Q, greater out-of-band rejection, etc.

Figure 14:
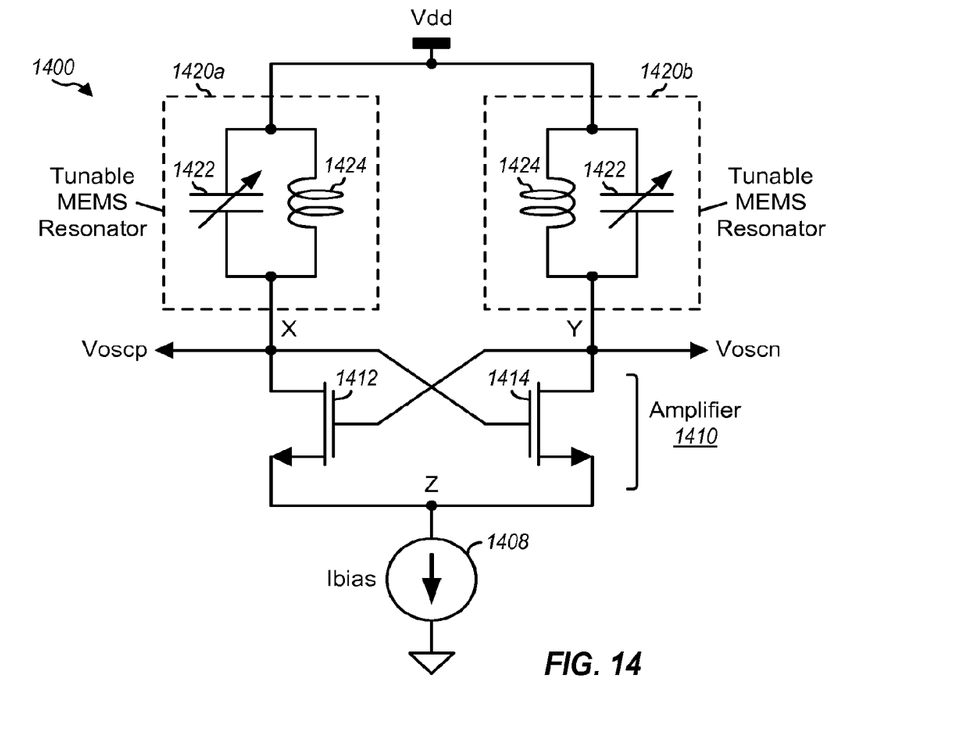
FIG. 14 shows an oscillator implemented with tunable MEMS resonators.

FIG. 14 shows a schematic diagram of an exemplary design of an oscillator 1400 implemented with two tunable MEMS resonators 1420a and 1420b. Oscillator 1400 may be used for oscillator 1172, oscillator 1182, and/or other oscillators in wireless device 1100 in FIG. 11. Oscillator 1400 includes an amplifier 1410 that provides signal amplification for a differential oscillator signal comprising Voscp and Voscn signals. Amplifier 1410 includes N-channel metal oxide semiconductor (NMOS) transistors 1412 and 1414 having their sources coupled to node Z. NMOS transistor 1412 has its drain coupled to node X and its gate coupled to node Y. NMOS transistor 1414 has its drain coupled to node Y and its gate coupled to node X. NMOS transistors 1412 and 1414 are thus cross-coupled. A current source 1408 is coupled between node Z and circuit ground and provides a bias current of Ibias for NMOS transistors 1412 and 1414. The Voscp and Voscn signals are provided via nodes X and Y, respectively.

Tunable MEMS resonator 1420*a* is coupled between node X and a power supply voltage, Vdd. Tunable MEMS resonator 1420*b* is coupled between node Y and the supply voltage. Tunable MEMS resonator 1420*a* and 1420*b* may each be implemented, e.g., as shown in FIGS. 1 through 4. As shown in FIG. 14, each tunable MEMS resonator 1420 may be modeled with a varactor 1422 coupled in parallel with an inductor 1424. The oscillation frequency of oscillator 1400 may be varied by adjusting the capacitance of varactor 1422 in each tunable MEMS resonator 1420.

In general, a MEMS resonator may comprise a first part and a second part. The first part (e.g., top part 160 in FIG. 1) may comprise a cavity and a post. The second part (e.g., bottom part 110 in FIG. 1) may be mated to the first part and may comprise a movable plate positioned under the post. The movable plate may be mechanically moved by a DC voltage to vary the resonance frequency of the MEMS resonator. The second part may comprise an electrode formed under the movable plate and applied with the DC voltage.

In an exemplary design, the cavity may have a rectangular shape and may be surrounded by four sidewalls formed in the first part, e.g., as shown in FIG. 3. The four sidewalls may have rounded corners to improve performance, e.g., as also shown in FIG. 3. In another exemplary design, the cavity may have a circular shape and may be surrounded by a circular sidewall formed in the first part, e.g., as shown in FIG. 4. In yet another exemplary design, the cavity may have an arbitrary shape contour and may be surrounded by an arbitrary shape contour wall formed in the first part. For all exemplary designs, the cavity may be empty or filled with a dielectric material.

The post may be positioned in the middle of the cavity, e.g., as shown in FIGS. 3 and 4. In an exemplary design, the post may have a rectangular shape with rounded corners, e.g., as shown in FIG. 3. In another exemplary design, the post may have a circular shape, e.g., as shown in FIG. 4. In yet another exemplary design, the post may have an arbitrary contour shape. The first part may further comprise one or more additional posts formed within the cavity.

In an exemplary design, the movable plate may be attached to the second part via an anchor and operated as a cantilever, e.g., as shown in FIG. 5. In another exemplary design, the movable plate may be attached to the second part via first and second anchors and operated as a bridge, e.g., as shown in FIG. 6. The movable plate may also be implemented in other manners with a MEMS switch or some other MEMS structure. In an exemplary design, the second part may further comprise at least one additional movable plate located under the post, e.g., as shown in FIG. 9. Each additional movable plate may be mechanically moved by a respective DC voltage to vary the resonance frequency of the MEMS resonator.

In an exemplary design, the second part may comprise a substrate, a dielectric layer formed over the substrate, and a metal layer formed over the dielectric layer, e.g., as shown in FIG. 1. The second part may be covered by the metal layer (e.g., metal layer 130) on the surface facing the first part. The first part may also be covered by a metal layer (e.g., metal layer 190) on the surface facing the second part.

In one exemplary design, a dielectric layer (e.g., dielectric layer 186 in FIG. 8) may be formed over the metal layer on the first part between the post and the movable plate. In another exemplary design, at least one dielectric spacer (e.g., dielectric spacers 182 and 184 in FIG. 7) may be formed on at least one side of the movable plate and may be used to prevent shorting of the movable plate to the metal layer in the first part. In yet another exemplary design, no dielectric layer or spacer is formed between the movable plate and the metal layer on the first part.

In another aspect, an apparatus may comprise a filter that receives an input signal and provides an output signal, e.g., as shown in FIG. 12. The filter may comprise at least one MEMS resonator. Each MEMS resonator may have a movable plate for adjusting the resonance frequency of the MEMS resonator. The filter may have a tunable frequency response that may be determined based on the resonance frequency of each MEMS resonator, e.g., as shown in FIG. 13.

In an exemplary design, the filter may comprise a single MEMS resonator, e.g., as shown in FIGS. 1 to 4. In another exemplary design, the filter may comprise multiple MEMS resonators coupled together via inter-resonator coupling, e.g., as shown in FIGS. 10 and 12. In one exemplary design, each MEMS resonator may comprise a first part (e.g., top part 160 in FIG. 1) and a second part (e.g., bottom part 110 in FIG. 1). The first part may comprise a cavity and a post. The second part may be mated to the first part and may comprise the movable plate located under the post. The movable plate may be mechanically moved by a DC voltage to vary the resonance frequency of the MEMS resonator.

In one exemplary design, the apparatus may be a wireless communication device, e.g., as shown in FIG. 11. The filter may be used in a transmitter or a receiver in the wireless communication device to pass a desired signal and to attenuate undesired signals and noise. The filter may also be used for other electronics devices.

In yet another aspect, an apparatus may comprise an oscillator that generates an oscillator signal. The oscillator may comprise (i) an amplifier to provide amplification for the oscillator signal and (ii) at least one MEMS resonator coupled to the amplifier, e.g., as shown in FIG. 14. Each MEMS resonator may have a movable plate for adjusting the resonance frequency of the MEMS resonator. The oscillator may have a tunable oscillation frequency that may be determined based on the resonance frequency of each MEMS resonator.

In an exemplary design, the amplifier may comprise (i) a first transistor (e.g., NMOS transistor 1412) providing amplification for a non-inverting signal of the oscillator signal and (ii) a second transistor (e.g., NMOS transistor 1414) providing amplification for an inverting signal of the oscillator signal. The at least one MEMS resonator may comprise (i) a first MEMS resonator (e.g., MEMS resonator 1420*a*) coupled to the first transistor and (ii) a second MEMS resonator (e.g., MEMS resonator 1420*b*) coupled to the second transistor. Each MEMS resonator may be implemented as described above.

In one exemplary design, the apparatus may be a wireless communication device, e.g., as shown in FIG. 11. The oscillator signal may be used to generate an LO signal for a transmitter or a receiver in the wireless communication device. The oscillator may also be used for other electronics devices.

Figure 15:
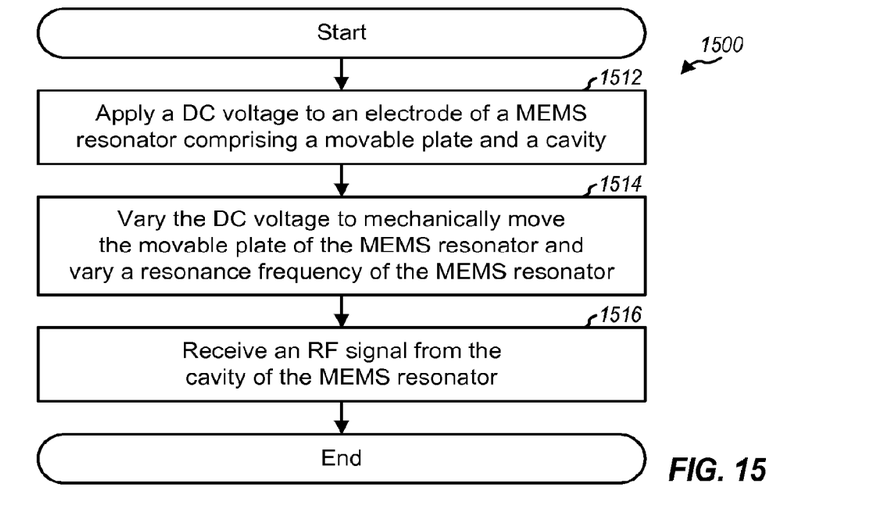
FIG. 15 shows a process for operating a MEMS resonator.

FIG. 15 shows an exemplary design of a process 1500 for operating a MEMS resonator. A DC voltage may be applied to an electrode of a MEMS resonator comprising a movable plate and a cavity (block 1512). The DC voltage may be varied to mechanically move the movable plate of the MEMS resonator and vary the resonance frequency of the MEMS resonator (block 1514). In one exemplary design, the DC voltage may be set to either (i) a first value to obtain the maximum resonance frequency for the MEMS resonator or (ii) a second value to obtain a minimum resonance frequency for the MEMS resonator. In another exemplary design, the DC voltage may be adjusted to a value between the first and second values. In general, the DC voltage may be varied in two or more discrete steps or in a continuous manner. An RF signal may be received from the cavity of the MEMS resonator (block 1516).

The tunable MEMS resonators described herein may be fabricated with various MEMS process technologies known in the art. The tunable MEMS resonators may be fabricated on a substrate (e.g., a glass or silicon substrate) and may be encapsulated in a suitable package. A substrate with tunable MEMS resonators may also be packaged together with a semiconductor IC die. The tunable MEMS resonators may also be fabricated on a semiconductor IC (e.g., a CMOS IC) using semiconductor process technology.

An apparatus implementing the tunable MEMS resonators described herein may be a stand-alone device or may be part of a larger device. A device may be (i) a stand-alone IC package, (ii) a set of one or more IC packages that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

The invention claimed is:

1. A resonator, comprising:
a cavity;
a post extending into the cavity;
a movable plate located within the cavity and spaced apart from the post;
a metal layer disposed on a surface of the post facing the movable plate, wherein a variable capacitor is formed between the movable plate and the metal layer;
a first dielectric layer located between the movable plate and the metal layer;
a biasing electrode located on the opposite side of the movable plate as the post; and
a second dielectric layer located between the movable plate and the biasing electrode, wherein application of a voltage to the biasing electrode causes movement of the movable plate towards the biasing electrode.

2. The resonator of claim 1, wherein application of the voltage to the biasing electrode increases a resonance frequency of the resonator.

3. The resonator of claim 1, wherein the first dielectric layer is located on a surface of the movable plate facing the post.

4. The resonator of claim 1, wherein the first dielectric layer is located on a surface of the metal layer facing the movable plate.

5. The resonator of claim 1, additionally including a second metal layer located on the same side of the second dielectric layer as the movable plate, wherein the movable plate is not coplanar with the second metal layer when no voltage is applied to the biasing electrode.

6. The resonator of claim 1, wherein the movable plate is supported on one side by an anchor, and wherein the movable plate is operated as a cantilever.

7. The resonator of claim 1, wherein the movable plate is supported on a first side by a first anchor and on a second side by a second anchor, and wherein the movable plate is operated as a bridge.

8. The resonator of claim 1, additionally including at least a second post extending into the cavity.

9. The resonator of claim 1, additionally including at least a second movable plate located within the cavity and spaced apart from the post.

10. A device including at least one resonator, each resonator comprising:
a cavity;
a post extending into the cavity;
a movable plate located within the cavity and spaced apart from the post, wherein the movable plate is supported on one side by an anchor, and wherein the movable plate is operated as a cantilever;
a biasing electrode located on the opposite side of the movable plate as the post; and
a dielectric layer located between the movable plate and the biasing electrode, wherein application of a voltage to the biasing electrode causes movement of the movable plate towards the biasing electrode to alter a resonance frequency of the resonator.

11. The device of claim 10, wherein the device includes a filter including the at least one resonator and configured to receive an input signal and provide an output signal, and wherein the filter has a tunable frequency response based on the resonance frequency of each of the at least one resonator.

12. The device of claim 11, wherein the device is a wireless communication device, and wherein the filter is used in a transmitter or a receiver of the wireless communication device to pass a desired signal or to attenuate undesired signals and noise.

13. The device of claim 10, wherein the device includes an oscillator, the oscillator including the at least one resonator and an amplifier coupled to the at least one resonator to provide amplification for an oscillator signal, wherein the oscillator has a tunable oscillation frequency determined based on the resonance frequency of each resonator.

14. The device of claim 13, wherein:
the amplifier includes:
a first transistor providing amplification for a non-inverting signal of the oscillator signal; and
a second transistor providing amplification for an inverting signal of the oscillator signal; and
the at least one resonator includes:
a first MEMS resonator coupled to the first transistor; and
a second MEMS resonator coupled to the second transistor.

15. The device of claim 13, wherein the device is a wireless communication device, and wherein the oscillator signal is used to generate a local oscillator signal for a transmitter or a receiver in the wireless communication device.

16. A method comprising:
applying a voltage to a biasing electrode of a resonator, the resonator including a post extending into a cavity, a movable plate located in the cavity and between the post and the biasing electrode, a metal layer on a surface of a post facing the movable plate, and a dielectric layer between the metal layer and the movable plate, wherein applying the voltage to the biasing electrode causes movement of the movable plate towards the biasing electrode to vary a resonance frequency of the resonator; and
receiving a radio frequency signal from the cavity of the resonator.

17. The method of claim 16, wherein applying a voltage includes applying a voltage which moves the movable plate against a second dielectric layer located between the movable plate and the biasing electrode to obtain a maximum resonance frequency for the resonator.

18. The method of claim 16, wherein applying a voltage includes applying a voltage between a first voltage and a second voltage, the first voltage corresponding to a maximum resonance frequency for the resonator, and the second voltage corresponding to a minimum resonance frequency for the resonator.

* * * * *